US010844255B2

(12) United States Patent
Ohashi et al.

(10) Patent No.: US 10,844,255 B2
(45) Date of Patent: Nov. 24, 2020

(54) PHOTOSENSITIVE ADHESIVE COMPOSITION

(71) Applicant: NISSAN CHEMICAL CORPORATION, Tokyo (JP)

(72) Inventors: Takuya Ohashi, Toyama (JP); Tomoyuki Enomoto, Toyama (JP); Takahiro Kishioka, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 30 days.

(21) Appl. No.: 16/329,068

(22) PCT Filed: Aug. 25, 2017

(86) PCT No.: PCT/JP2017/030568
§ 371 (c)(1),
(2) Date: Feb. 27, 2019

(87) PCT Pub. No.: WO2018/043342
PCT Pub. Date: Mar. 8, 2018

(65) Prior Publication Data
US 2019/0211242 A1 Jul. 11, 2019

(30) Foreign Application Priority Data
Aug. 30, 2016 (JP) .................................. 2016-167936

(51) Int. Cl.
*C08F 2/46* (2006.01)
*C08F 2/50* (2006.01)
(Continued)

(52) U.S. Cl.
CPC .......... *C09J 179/04* (2013.01); *C08F 290/06* (2013.01); *C08F 290/061* (2013.01); *C08F 290/064* (2013.01); *C08F 299/02* (2013.01); *C08G 59/26* (2013.01); *C08G 59/3236* (2013.01); *C08G 73/0622* (2013.01); *C08G 73/0638* (2013.01); *C08G 73/0655* (2013.01); *C08G 75/045* (2013.01); *C09J 9/00* (2013.01); *C09J 11/06* (2013.01); *C09J 163/00* (2013.01); *C09J 163/06* (2013.01); *C09J 163/10* (2013.01); *C09J 167/00* (2013.01); *C09J 167/07* (2013.01);
(Continued)

(58) Field of Classification Search
CPC ...... C09J 179/04; C09J 167/07; C09J 167/00; C09J 163/10; C09J 163/06; C09J 9/00; C09J 11/06; C09J 171/08; C09J 2205/31; C08F 290/061; C08F 290/06; C08F 299/02; G03F 7/09; G03F 7/027; G03F 7/0004; C08G 73/0644; C08G 73/0638; C08G 73/0622; C08G 59/3236; C08G 59/26; C08G 75/045; C08G 85/0004; C08K 5/14; C08K 5/101

USPC ................. 522/60, 6, 71, 189, 184, 1; 520/1
See application file for complete search history.

(56) References Cited

U.S. PATENT DOCUMENTS

| 8,557,893 B2 * | 10/2013 | Yang ...................... A61K 6/887 523/116 |
| 2014/0228488 A1 * | 8/2014 | Tamura .................. C09J 179/04 524/111 |
| 2018/0362696 A1 * | 12/2018 | Ohashi ................ C08F 290/061 |

FOREIGN PATENT DOCUMENTS

| JP | 2008-143954 A | 6/2008 |
| WO | 2012/169580 A1 | 12/2012 |
| WO | 2013/035787 A1 | 3/2013 |

OTHER PUBLICATIONS

Nov. 7, 2017 International Search Report issued in International Patent Application No. PCT/JP2017/030568.
(Continued)

*Primary Examiner* — Jessica Whiteley
(74) *Attorney, Agent, or Firm* — Oliff PLC

(57) ABSTRACT

A novel photosensitive adhesive composition including the following components (A), (B), (C), and (D): Component (A): a polymer having a structural unit of the following formula (1) and a structure of the following formula (2) at a terminal, Component (B): a polymer having the structural unit of formula (1), and a carboxy group or hydroxy group at a terminal, Component (C): a radical photopolymerization initiator, and Component (D): a solvent, wherein the content by mass of the component (B) is larger than that of the component (A), (1)

(2)

(wherein X is a $C_{1-6}$ alkyl group, a vinyl group, an allyl group, or a glycidyl group, m and n are each independently 0 or 1, Q is a divalent $C_{1-16}$ hydrocarbon group, Z is a divalent $C_{1-4}$ linking group, the divalent linking group being bonded to an —O— group in formula (1), and $R^1$ is a hydrogen atom or a methyl group.)

6 Claims, No Drawings

(51) Int. Cl.

| | |
|---|---|
| *C08G 61/04* | (2006.01) |
| *C09J 179/04* | (2006.01) |
| *C08F 290/06* | (2006.01) |
| *C09J 167/07* | (2006.01) |
| *C09J 167/00* | (2006.01) |
| *C09J 171/08* | (2006.01) |
| *C08F 299/02* | (2006.01) |
| *G03F 7/027* | (2006.01) |
| *C08G 75/045* | (2016.01) |
| *C08G 73/06* | (2006.01) |
| *C09J 11/06* | (2006.01) |
| *C09J 163/10* | (2006.01) |
| *C09J 163/06* | (2006.01) |
| *C08G 59/26* | (2006.01) |
| *C09J 163/00* | (2006.01) |
| *C08G 59/32* | (2006.01) |
| *G03F 7/004* | (2006.01) |
| *C09J 9/00* | (2006.01) |
| *G03F 7/09* | (2006.01) |
| *C08G 85/00* | (2006.01) |
| *C08K 5/101* | (2006.01) |
| *C08K 5/14* | (2006.01) |

(52) U.S. Cl.
CPC ............ *C09J 171/08* (2013.01); *G03F 7/004* (2013.01); *G03F 7/027* (2013.01); *G03F 7/09* (2013.01); *C08G 73/0644* (2013.01); *C08G 85/004* (2013.01); *C08K 5/101* (2013.01); *C08K 5/14* (2013.01); *C09J 2301/416* (2020.08)

(56) References Cited

OTHER PUBLICATIONS

Nov. 7, 2017 Written Opinion of the International Searching Authority issued in International Patent Application No. PCT/JP2017/030568.

\* cited by examiner

PHOTOSENSITIVE ADHESIVE COMPOSITION

TECHNICAL FIELD

The present invention relates to a photosensitive adhesive composition containing a polymer having an introduced radically-crosslinkable moiety.

BACKGROUND ART

In recent years, higher integration of a semiconductor device has been required with enhancement in performance and miniaturization of an electronic device such as a cell phone and an IC card. To achieve the higher integration, a finer semiconductor element and a stack structure in which semiconductor elements are stacked longitudinally have been investigated. In production of stack structure, an adhesive is used for junction between semiconductor elements. As the adhesive, an acrylic resin, an epoxy resin, and a silicone resin are publicly known. The resins are resistant to heat of only about 250° C., and thus the resins cannot be used in a step requiring a high temperature of 250° C. or higher such as electrode junction of metal bumps and ion diffusion.

Patent Document 1 discloses an isocyanurate ring-containing polymer that is used for an adhesive for optical semiconductors, and a composition containing the isocyanurate ring-containing polymer. According to Patent Document 1, the isocyanurate ring-containing polymer can be obtained by a reaction of an N-monosubstituted isocyanuric acid with a dihalogenated compound in the presence of an alkali metal compound or a hydrosilylation reaction of an N,N',N"-trisubstituted isocyanuric acid with a silane compound. Patent Document 1 also discloses that the composition can serve as an adhesive for optical semiconductors under heating in an oven at 50° C. to 250° C. for 30 minutes to 4 hours to achieve adhesion.

The market for flat panel displays (FPDs) typified by a liquid crystal display (LCD) and an organic EL (OLED) display rapidly increases. In a liquid crystal display, a glass substrate is used as a base material of a display panel. To make the liquid crystal display thinner, lighter, and more flexible and to employ a Roll-to-Roll process for decreased processing cost, a flexible display using a plastic substrate has been developed. As a resin material used for a publicly known plastic substrate, a PET resin, a PEN resin, and a PC resin are known. The resins are resistant to heat of only about 250° C. Thus, the resins cannot be used in the step requiring a high temperature of 250° C. or higher, which is conventionally required for a process for forming a thin-film transistor (TFT).

Patent Document 2 discloses a composition that forms a cured film having a high transmittance for visible light and excellent heat resistance and solvent resistance. Patent Document 2 also discloses that the composition can be used as an adhesive.

PRIOR ART DOCUMENTS

Patent Documents

Patent Document 1: Japanese Patent Application Publication No. 2008-143954 (JP 2008-143954 A)
Patent Document 2: International publication WO 2013/035787

SUMMARY OF THE INVENTION

Problem to be Solved by the Invention

The composition described in Patent Document 2 is not a photosensitive resin composition. Thus, from a film formed from the composition in Patent Document 2, a pattern having a desired shape cannot be formed by a lithography process. Accordingly, an adhesive composition that enables patterning by a lithography process and does not necessarily need a heating step at high temperature during adhesion is required.

Means for Solving the Problems

The present inventors have intensively investigated to solve the problems, and as a result, found that when in a composition containing a polymer having a specific terminal structure and a polymer having a carboxy group or hydroxy group at a terminal instead of the specific terminal structure, the content by mass of the later is larger than that of the former, the composition eliminates the need for the heating step at the aforementioned temperature and has a desired adhesion force.

Specifically, a first aspect of the present invention is a photosensitive adhesive composition comprising the following components (A), (B), (C), and (D):
Component (A): a polymer having a structural unit of the following formula (1) and a structure of the following formula (2) at a terminal,
Component (B): a polymer having the structural unit of formula (1), and a carboxy group or hydroxy group at a terminal,
Component (C): a radical photopolymerization initiator, and
Component (D): a solvent,
wherein the content by mass of the component (B) is larger than that of the component (A),

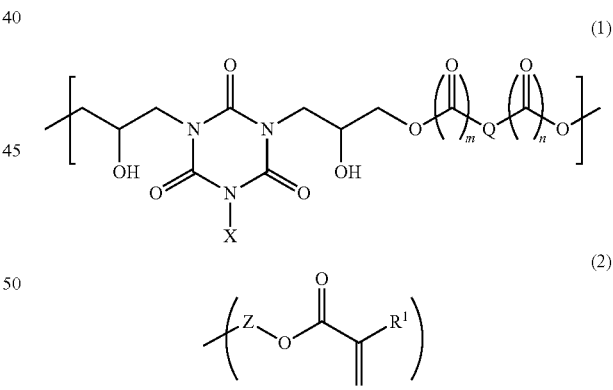

(wherein X is a $C_{1-6}$ alkyl group, a vinyl group, an allyl group, or a glycidyl group, m and n are each independently 0 or 1, Q is a divalent $C_{1-16}$ hydrocarbon group, Z is a divalent $C_{1-4}$ linking group, the divalent linking group being bonded to an —O— group in formula (1), and $R^1$ is a hydrogen atom or a methyl group.)

For example, the divalent hydrocarbon group of Q in formula (1) is a linear or branched alkylene group, a group containing two carbon atoms bonded through a double bond, or a group containing in a main chain an alicyclic hydrocarbon group or aromatic hydrocarbon group that optionally has at least one substituent.

For example, the divalent linking group of Z in formula (2) is a linear or branched alkylene group optionally having at least one hydroxy group as a substituent.

The mass ratio of the component (A) to the component (B) is preferably 1:2 to 1:20.

The photosensitive adhesive composition may further contain a bifunctional (meth)acrylate and/or a multifunctional thiol.

A second aspect of the present invention is an adhesion method comprising steps of: applying the photosensitive adhesive composition according to the first aspect of the present invention to a first substrate; pre-baking the photosensitive adhesive composition applied to the first substrate at a temperature of 50° C. to 160° C.; exposing the coating film formed on the first substrate after the pre-baking; developing the coating film after the exposure; and bonding a second substrate to the first substrate after the development and thermally curing the coating film by heating.

Effects of the Invention

The photosensitive adhesive composition of the present invention contains a polymer having a specific terminal structure and a polymer having a carboxy group or hydroxy group at a terminal instead of the specific terminal structure at a predetermined mass ratio as polymers having an introduced radically-crosslinkable moiety at a terminal, and further contains a radical photopolymerization initiator. Thus, the photosensitive adhesive composition allows a cured film having excellent solvent resistance to be formed without a heating step at a temperature of 250° C. or higher. Further, the cured film formed from the photosensitive adhesive composition of the present invention has excellent vapor transmission preventing property. The photosensitive adhesive composition of the present invention has a high adhesion force, and thus the photosensitive adhesive composition is useful as an adhesive for semiconductor elements, micro electro mechanical systems (MEMSs), nano electro mechanical systems (NEMSs), organic EL displays, and image sensors.

MODES FOR CARRYING OUT THE INVENTION

<Component (A)>

A photosensitive adhesive composition of the present invention contains a polymer having a structural unit of formula (1), and a structure of formula (2) at a terminal as a component (A). The weight average molecular weight of this polymer is determined by gel permeation chromatography (hereinafter abbreviated as GPC) analysis described below, and for example, is 1,000 to 50,000, and preferably 1,000 to 20,000 in terms of standard polystyrene.

Examples of a $C_{1-6}$ alkyl group of X in formula (1) include methyl group, ethyl group, n-propyl group, i-propyl group, n-butyl group, i-butyl group, s-butyl group, tert-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

A divalent $C_{1-16}$ hydrocarbon group of Q in formula (1) is a linear or branched alkylene group, a group containing two carbon atoms bonded through a double bond, or a group containing in a main chain an alicyclic hydrocarbon group or aromatic hydrocarbon group that optionally has at least one substituent. Examples of such a group include groups of the following formulae (a) to (m).

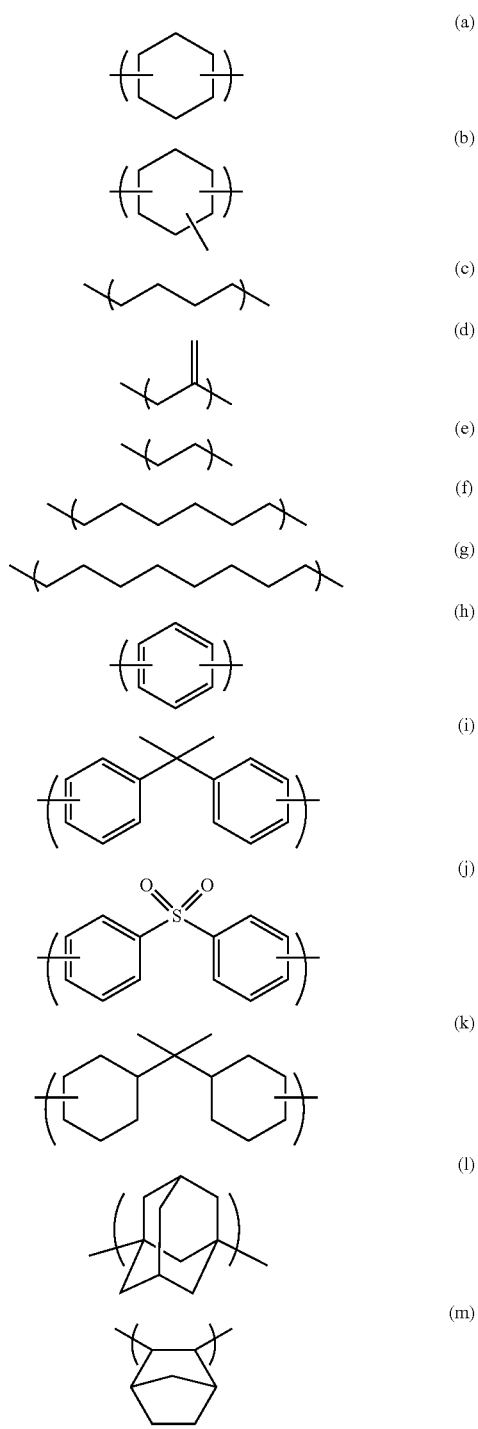

For example, a divalent $C_{1-4}$ linking group of Z in formula (2) is a linear or branched alkylene group optionally having at least one hydroxy group as a substituent. When Z is such an alkylene group, examples of the terminal structure of formula (2) include structures of the following formulae (2-1) and (2-2).

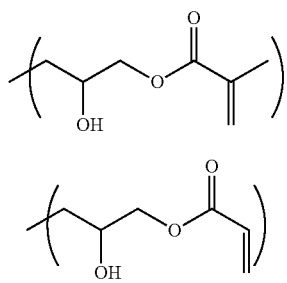

(2-1)

(2-2)

For example, the polymer that is the component (A) is synthesized through the following process. A diepoxy compound having a triazinetrione structure is reacted with a compound having two carboxy groups or hydroxy groups to obtain a polymer intermediate having the structural unit of formula (1), and a carboxyl group or hydroxy group at a terminal. Subsequently, the polymer intermediate having the aforementioned terminal is reacted with a (meth)acrylate having an epoxy group.

<Component (B)>

The photosensitive adhesive composition of the present invention contains a polymer having the structural unit of formula (1), and a carboxy group or hydroxy group at a terminal as a component (B). The weight average molecular weight of this polymer is determined by GPC analysis described below, and for example, is 1,000 to 50,000, preferably 1,000 to 20,000, and more preferably 1,000 to 10,000 in terms of standard polystyrene.

For example, the polymer that is the component (B) is synthesized through the following process. A diepoxy compound having a triazinetrione structure is reacted with a compound having two carboxy groups or hydroxy groups to obtain the polymer having the structural unit of formula (1), and a carboxyl group or hydroxy group at a terminal.

<Component (C)>

The photosensitive adhesive composition of the present invention contains a radical photopolymerization initiator as a component (C). The photopolymerization initiator is not particularly limited as long as it is a compound having absorption at the wavelength region of a light source used during photocuring. Examples thereof include organic peroxides such as tert-butylperoxy-iso-butyrate, 2,5-dimethyl-2,5-bis(benzoyldioxy)hexane, 1,4-bis[α-(tert-butyldioxy)-iso-propoxy]benzene, di-tert-butyl peroxide, 2,5-dimethyl-2,5-bis(tert-butyldioxy)hexene hydroperoxide, α-(iso-propylphenyl)-iso-propyl hydroperoxide, tert-butyl hydroperoxide, 1,1-bis(tert-butyldioxy)-3,3,5-trimethylcyclohexane, butyl 4,4-bis(tert-butyldioxy)valerate, cyclohexanone peroxide, 2,2',5,5'-tetra(tert-butylperoxycarbonyl) benzophenone, 3,3',4,4'-tetra(tert-butylperoxycarbonyl) benzophenone, 3,3',4,4'-tetra(tert-amylperoxycarbonyl) benzophenone, 3,3',4,4'-tetra(tert-hexylperoxycarbonyl) benzophenone, 3,3'-bis(tert-butylperoxycarbonyl)-4,4'-dicarboxybenzophenone, tert-butyl peroxybenzoate, and di-tert-butyl diperoxyisophthalate; quinones such as 9,10-anthraquinone, 1-chloroanthraquinone, 2-chloroanthraquinone, octamethylanthraquinone, and 1,2-benzanthraquinone; benzoin derivatives such as benzoin methyl, benzoin ethyl ether, α-methylbenzoin, and α-phenylbenzoin; alkylphenone-based compounds such as 2,2-dimethoxy-1,2-diphenylethan-1-one, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, 2-hydroxy-1-[4-{4-(2-hydroxy-2-methyl-propionyl) benzyl}-phenyl]-2-methyl-propan-1-one, phenylglyoxylic acid methyl ester, 2-methyl-1-[4-(methylthio)phenyl]-2-morpholinopropan-1-one, 2-benzyl-2-dimethylamino-1-(4-morpholinophenyl)-1-butanone, and 2-dimethylamino-2-(4-methyl-benzyl)-1-(4-morpholin-4-yl-phenyl)-butan-1-one; acylphosphine oxide-based compounds such as bis(2,4,6-trimethylbenzoyl)-phenylphosphine oxide and 2,4,6-trimethylbenzoyl-diphenyl-phosphine oxide; and oxime ester-based compounds such as 2-(O-benzoyloxime)-1-[4-(phenylthio)phenyl]-1,2-octanedione and 1-(O-acetyloxime)-1-[9-ethyl-6-(2-methylbenzoyl)-9H-carbazol-3-yl]-ethanone.

The radical photopolymerization initiator is available as a commercial product. Examples thereof include IRGACURE [registered trademark] 651, 184, 2959, 127, 907, 369, 379EG, 819, 819DW, 1800, 1870, 784, OXE01, OXE02, 250, 1173, MBF, TPO, 4265, and TPO (all available from BASF), KAYACURE [registered trademark] DETX, MBP, DMBI, EPA, and OA (all available from NIPPON KAYAKU Co., Ltd.), VICURE-10 and 55 (all available from STAUFFER Co. LTD), ESACURE KIP150, TZT, 1001, KT046, KB1, KL200, KS300, and EB3, triazine-PMS, triazine A, and triazine B (all available from Nihon Siber-Hegner K.K.), and ADEKA Optomer N-1717, N-1414, and N-1606 (all available from ADEKA Corporation). The radical photopolymerization initiators may be used alone, or two or more types thereof may be used in combination.

The content of the radical photopolymerization initiator in the photosensitive adhesive composition of the present invention is, for example, 0.01 phr to 30 phr, and preferably 0.1 phr to 15 phr, relative to the total content of the polymers as the components (A) and (B). When the content is smaller than the lower limit value, sufficient curing property is not achieved. Herein, phr means the mass of the radical photopolymerization initiator relative to 100 g of polymer.

<Component (D)>

The photosensitive adhesive composition of the present invention contains a solvent. The solvent is not particularly limited as long as it is an organic solvent usable in a step of producing a semiconductor device. Examples thereof include ketones such as cyclohexanone, methyl isoamyl ketone, 2-butanone, and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or dipropylene glycol monoacetate, and monomethyl ether, monoethyl ether, monopropyl ether, monobutyl ether, and monophenyl ether thereof; cyclic ethers such as dioxane; lactones such as γ-butyrolactone; and esters such as methyl lactate, ethyl lactate, methyl acetate, ethyl acetate, butyl acetate, methyl pyruvate, ethyl pyruvate, methyl methoxypropionate, ethyl ethoxypropionate, and methyl 2-hydroxyisobutyrate. The organic solvents may be used alone, or two or more types thereof may be used as a mixture. A solid content is a component of the photosensitive adhesive composition of the present invention except for the solvent. The percentage of the solid content in the photosensitive adhesive composition is, for example, 1% by mass to 80% by mass.

<Crosslinkable Compound>

The photosensitive adhesive composition of the present invention may contain a bifunctional (meth)acrylate as a crosslinkable compound, if necessary. Herein, the bifunctional (meth)acrylate is a compound having acryloyl group or methacryloyl group at both terminals of the molecule. Examples of the compound include tricyclodecane dimethanol diacrylate, tricyclodecane dimethanol dimethacrylate, tricyclodecane diethanol diacrylate, and tricyclodecane diethanol dimethacrylate.

The bifunctional (meth)acrylate is available as a commercial product. Examples thereof include A-DCP and DCP (all available from Shin Nakamura Chemical Co., Ltd.). The compounds may be used alone, or two or more types thereof may be used in combination.

The content of the bifunctional (meth)acrylate in the photosensitive adhesive composition of the present invention is, for example, 5% by mass to 50% by mass, and preferably 10% by mass to 30% by mass, relative to the total content of the polymers as the components (A) and (B).

The photosensitive adhesive composition of the present invention may further contain a multifunctional thiol as a crosslinkable compound, if necessary. Herein, the multifunctional thiol is a compound having a plurality of (e.g., two, three, or four) thiol groups at a terminal of the molecule. Examples of the compound include pentaerythritol tetrakis(3-mercaptobutyrate), 1,4-bis(3-mercaptobutyryloxy)butane, 1,3,5-tris(3-mercaptobutyryloxyethyl)-1,3,5-triazine-2,4,6(1H,3H,5H)-trione, trimethylolpropane tris(3-mercaptobutyrate), and trimethylolethane tris(3-mercaptobutyrate).

The multifunctional thiol is available as a commercial product. Examples thereof include KarenzMT [registered trademark] PE1, BD1, and NR1 (all available from Showa Denko K.K.). The compounds may be used alone, or two or more types thereof may be used in combination.

The content of the multifunctional thiol in the photosensitive adhesive composition of the present invention is, for example, 0.1% by mass to 15% by mass, and preferably 0.5% by mass to 10% by mass, relative to the total content of the polymers as the components (A) and (B).

<Other Additive>

The photosensitive adhesive composition of the present invention may further contain an additive such as an epoxy compound, a photoacid generator, a thermal acid generator, an inorganic filler, and a surfactant, if necessary.

When the photosensitive adhesive composition of the present invention contains an epoxy compound, examples of the epoxy compound include 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, 1,2-cyclohexanedicarboxylic acid diglycidyl ester, 4,4'-methylenebis(N,N-diglycidyl aniline), 3,4-epoxycyclohexylmethyl 3,4-epoxycyclohexanecarboxylate, trimethylolethane triglycidyl ether, triglycidyl-p-aminophenol, tetraglycidyl methaxylene diamine, tetraglycidyl diaminodiphenylmethane, tetraglycidyl-1,3-bisaminomethylcyclohexane, bisphenol-A-diglycidyl ether, bisphenol-S-diglycidyl ether, pentaerythritol tetraglycidyl ether, resorcinol diglycidyl ether, phthalic acid diglycidyl ester, neopentyl glycol diglycidyl ether, polypropylene glycol diglycidyl ether, tetrabromobisphenol-A-diglycidyl ether, bisphenol hexafluoroacetone diglycidyl ether, pentaerythritol diglycidyl ether, tris(2,3-epoxypropyl)isocyanurate, monoallyldiglycidyl isocyanurate, diglycerol polydiglycidyl ether, pentaerythritol polyglycidyl ether, 1,4-bis(2,3-epoxypropoxyperfluoroisopropyl)cyclohexane, sorbitol polyglycidyl ether, trimethylolpropane polyglycidyl ether, resorcin diglycidyl ether, 1,6-hexanediol diglycidyl ether, polyethylene glycol diglycidyl ether, phenyl glycidyl ether, p-tert-butylphenyl glycidyl ether, adipic acid diglycidyl ether, o-phthalic acid diglycidyl ether, dibromophenyl glycidyl ether, 1,2,7,8-diepoxyoctane, 1,6-dimethylolperfluorohexane diglycidyl ether, 4,4'-bis(2,3-epoxypropoxyperfluoroisopropyl)diphenyl ether, 2,2-bis(4-glycidyloxyphenyl)propane, 3,4-epoxycyclohexylmethyl-3',4'-epoxycyclohexanecarboxylate, 3,4-epoxycyclohexyloxirane, 2-(3,4-epoxycyclohexyl)-3',4'-epoxy-1,3-dioxane-5-spirocyclohexane, 1,2-ethylenedioxy-bis(3,4-epoxycyclohexylmethane), 4',5'-epoxy-2'-methylcyclohexylmethyl-4,5-epoxy-2-methylcyclohexanecarboxylate, ethylene glycol-bis(3,4-epoxycyclohexanecarboxylate), bis(3,4-epoxycyclohexylmethyl) adipate, and bis(2,3-epoxycyclopentyl) ether. Further examples of the epoxy compound include copolymers of (meth)acrylate having an epoxy group such as glycidyl acrylate and glycidyl methacrylate.

The epoxy compound is available as a commercial product. Examples thereof include EPOLEAD [registered trademark] GT-401, GT-403, GT-301, GT-302, and PB3600, CELLOXIDE [registered trademark] 2021P, 2000, 3000, EHPE3150, and EHPE3150CE, and CYCLOMER [registered trademark] M100 (all available from Daicel Corporation), and EPICLON [registered trademark] 840, 840-S, N-660, and N-673-80M (all available from DIC Corporation).

When the photosensitive adhesive composition of the present invention contains a photoacid generator, examples of the photoacid generator include IRGACURE [registered trademark] PAG103, PAG108, PAG121, PAG203, CG1725, and GSID-26-1 (all available from BASF), WPAG-145, WPAG-170, WPAG-199, WPAG-281, WPAG-336, and WPAG-367 (all available from Wako Pure Chemical Industries, Ltd.), and TFE-triazine, TME-triazine, MP-triazine, dimethoxy triazine, TS-91, and TS-01 (available from SANWA CHEMICAL Co., Ltd.).

When the photosensitive adhesive composition of the present invention contains a thermal acid generator, examples of the thermal acid generator include K-PURE [registered trademark] TAG-2689, TAG-2690, TAG-2700, CXC-1612, CXC-1614, CXC-1615, and CXC-1821 (all available from King Industries Inc.).

When the photosensitive adhesive composition of the present invention contains an inorganic filler, examples of the inorganic filler include sols of silica, aluminum nitride, boron nitride, zirconia, and alumina.

When the photosensitive adhesive composition of the present invention contains a surfactant, examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkylaryl ethers such as polyoxyethylene octylphenyl ether and polyoxyethylene nonylphenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

The surfactant is available as a commercial product. Examples thereof include fluorosurfactant such as Eftop [registered trademark] EF301, EF303, and EF352 (all available from Mitsubishi Materials Electronic Chemicals Co., Ltd.), MEGAFACE [registered trademark] F171, F173, R-30, R-30N, R-40, and R-40-LM (available from DIC Corporation), Fluorad FC430 and FC431 (all available from Sumitomo 3M, Ltd.), AsahiGuard [registered trademark] AG710, and Surflon [registered trademark] S-382, SC101, SC102, SC103, SC104, SC105, and SC106 (all available from Asahi Glass Co., Ltd.), and organosiloxane polymer KP341 (available from Shin-Etsu Chemical Co., Ltd.). The surfactants may be used alone, or two or more types thereof may be used in combination.

<Adhesion Method>

Substrates can be adhered to each other using the photosensitive adhesive composition of the present invention by the following steps, that is, steps of applying the photosensitive adhesive composition of the present invention to a first substrate, pre-baking the photosensitive adhesive composition applied to the first substrate at 50° C. to 160° C., exposing the coating film on the first substrate after the pre-baking, developing the coating film after the exposure, and bonding a second substrate to the first substrate after the development and thermally curing the coating film by heating.

Examples of a method for applying the photosensitive adhesive composition of the present invention to the first substrate include a spin coating method, a potting method, a dip method, a flow coating method, an inkjet method, a spraying method, a bar coating method, a gravure coating method, a slit coating method, a roll coating method, a transfer printing method, coating by a brush, a blade coating method, and an air-knife coating method.

Examples of the first substrate coated with the photosensitive adhesive composition of the present invention and the second substrate bonded to the first substrate include a silicon wafer coated with a silicon oxide film, a silicon nitride film, or a silicon nitride oxide film, a silicon nitride substrate, a quartz substrate, a crystal substrate, an alkali-free glass substrate, a low alkaline glass substrate, a crystalline glass substrate, a glass substrate having an indium tin oxide (ITO) film or an indium zinc oxide (IZO) film, and a substrate made of polyethylene terephthalate (PET), polyethylene naphthalate (PEN), triacetylcellulose (TAC), polyethylene (PE), polyimide (PI), polyamide (PA), polyvinyl chloride (PVC), polycycloolefin (PCO), polyvinylidene chloride (PVDC), polyvinyl alcohol (PVA), polypropylene (PP), polycarbonate (PC), polystyrene (PS), polyacrylonitrile (PAN), an ethylene-vinyl acetate copolymer (EVA), an ethylene-vinyl alcohol copolymer (EVOH), an ethylene-methacrylic acid copolymer (EMMA), or polymethacrylic acid (PMMA).

In the pre-baking, the solvent is removed from the photosensitive adhesive composition applied to the first substrate. As a result, the flowability of the composition is lost to form the coating film on the substrate.

Between the step of exposing the coating film and the step of developing the coating film, for example, post exposure bake (also abbreviated to PEB) at 50° C. to 160° C. may be performed, if necessary.

Examples of a light source used in exposing the coating film include a g-line, a h-line, an i-line, a ghi-line broadband, and a KrF excimer laser.

Examples of a developer used in developing the coating film include an alkaline aqueous solution and the solvent contained in the photosensitive adhesive composition. Examples of the alkaline aqueous solution include an aqueous solution of an alkaline metal hydroxide such as potassium hydroxide and sodium hydroxide, an aqueous solution of a quaternary ammonium hydroxide such as tetramethylammonium hydroxide, tetraethylammonium hydroxide, and choline, and an aqueous solution of an amine such as ethanolamine, propylamine, and ethylenediamine. Further, an organic solvent that is publicly known as a solvent of a photoresist solution used in a photolithography step may be used as a developer. Examples of the organic solvent include propylene glycol 1-monomethyl ether 2-acetate, 1-methoxy-2-propanol, cyclohexanone, and 2-propanol. The organic solvents may be used alone, or two or more types thereof may be used in combination.

After developing the coating film, the second substrate is bonded to the first substrate. For example, the heating temperature during thermally curing the coating film is 180° C. to 240° C., and the heating time is 30 minutes to 2 hours. During bonding the second substrate to the first substrate, heating is preferably carried out at 100° C. to 200° C.

EXAMPLES

Hereinafter, the present invention will be described in more detail on the basis of Examples, and the present invention is not limited to these Examples.

In GPC analysis of polymers obtained in Synthesis Examples described below, the following apparatus is used, and the measurement conditions are as follows.

Apparatus: integrated high-performance GPC system HLC-8220GPC manufactured by TOSOH CORPORATION
Column: KF-G, KF804L
Column temperature: 40° C.
Solvent: tetrahydrofuran (THF)
Flow rate: 1.0 mL/min
Standard sample: Polystyrene
Detector: RI Synthesis Example 1

127.99 g of 1,2-cyclohexanedicarboxylic acid, 175.00 g of monoallyl diglycidyl isocyanurate, and 7.20 g of benzyltriethylammonium chloride were dissolved in 465.28 g of propylene glycol 1-monomethyl ether 2-acetate, and the solution was then reacted at 140° C. for 4 hours to obtain a solution containing a polymer. The obtained solution was cooled to room temperature. In the solution, 28.71 g of glycidyl methacrylate and 1.15 g of benzyltriethylammonium chloride were dissolved, and the solution was reacted at 140° C. for 3 hours to obtain a solution containing a polymer. The obtained polymer was analyzed by GPC. The weight average molecular weight of the polymer in terms of standard polystyrene was 3,500. The obtained polymer is considered to be a polymer having a structural unit of the following formula (1a) and a structure of the following formula (2a) at a terminal.

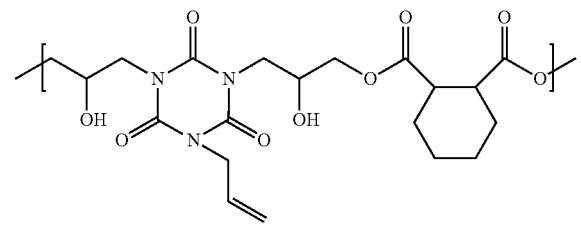

(1a)

-continued

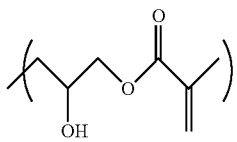

(2a)

Synthesis Example 2

146.27 g of 1,2-cyclohexanedicarboxylic acid, 200.00 g of monoallyl diglycidyl isocyanurate, and 4.11 g of benzyltriethylammonium chloride were dissolved in 350.38 g of propylene glycol 1-monomethyl ether 2-acetate, and the solution was then reacted at 140° C. for 4 hours to obtain a solution containing a polymer. The obtained polymer was analyzed by GPC. The weight average molecular weight in terms of standard polystyrene was 3,100. The obtained polymer is considered to be a polymer having a structural unit of the following formula (1a).

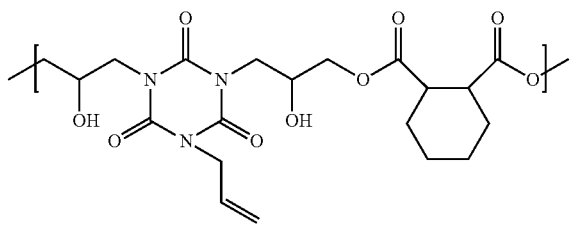

(1a)

Synthesis Example 3

138.15 g of 1,2-cyclohexanedicarboxylic acid, 200.00 g of monoallyl diglycidyl isocyanurate, and 4.11 g of benzyltriethylammonium chloride were dissolved in 342.26 g of propylene glycol 1-monomethyl ether 2-acetate, and the solution was then reacted at 140° C. for 4 hours to obtain a solution containing a polymer. The obtained polymer was analyzed by GPC. The weight average molecular weight in terms of standard polystyrene was 4,100. The obtained polymer is considered to be a polymer having a structural unit of the following formula (1a).

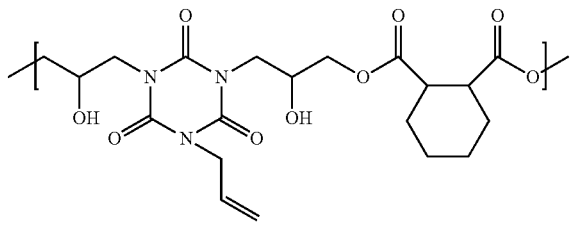

(1a)

Preparative Example 1

The solution containing the polymer obtained in Synthesis Example 1 was placed in a bottle filled with a cation exchange resin (15JWET, ORGANO CORPORATION) and an anion exchange resin (Monosphere 550A Muromachi Technos Co., Ltd.), and stirred for 4 hours.

Preparative Example 2

The solution containing the polymer obtained in Synthesis Example 2 was placed in a bottle filled with a cation exchange resin (15JWET, ORGANO CORPORATION) and an anion exchange resin (Monosphere 550A Muromachi Technos Co., Ltd.), and stirred for 4 hours.

Preparative Example 3

The solution containing the polymer obtained in Synthesis Example 3 was placed in a bottle filled with a cation exchange resin (15JWET, ORGANO CORPORATION) and an anion exchange resin (Monosphere 550A Muromachi Technos Co., Ltd.), and stirred for 4 hours.

Example 1

3.2 g of the solution containing the polymer obtained in Preparative Example 1, 10.40 g of the solution containing the polymer obtained in Preparative Example 2, 0.022 g of IRGACURE [registered trademark] OXE01 (available from BASF), 0.33 g of tricyclodecanedimethanol diacrylate (available from Shin Nakamura Chemical Co., Ltd.), and 0.055 g of pentaerythritol tetrakis(3-mercaptobutyrate) (available from Showa Denko K.K.) were dissolved in 5.53 g of propylene glycol 1-monomethyl ether 2-acetate to prepare a composition. The composition was then filtered through a polyethylene microfilter having a pore diameter of 3 μm to prepare a photosensitive adhesive composition. The mass ratio of a polymer solid content of Preparative Example 1 to a polymer solid content of Preparative Example 2 was 1:3.

Example 2

3.5 g of the solution containing the polymer obtained in Preparative Example 1, 17.30 g of the solution containing the polymer obtained in Preparative Example 2, 0.023 g of IRGACURE [registered trademark] OXE01 (available from BASF), 0.34 g of tricyclodecanedimethanol diacrylate (available from Shin Nakamura Chemical Co., Ltd.), and 0.056 g of pentaerythritol tetrakis(3-mercaptobutyrate) (available from Showa Denko K.K.) were dissolved in 8.28 g of propylene glycol 1-monomethyl ether 2-acetate to prepare a composition. The composition was then filtered through a polyethylene microfilter having a pore diameter of 3 μm to prepare a photosensitive adhesive composition. The mass ratio of the polymer solid content of Preparative Example 1 to the polymer solid content of Preparative Example 2 was 1:5.

Example 3

2.0 g of the solution containing the polymer obtained in Preparative Example 1, 13.35 g of the solution containing the polymer obtained in Preparative Example 2, 0.014 g of IRGACURE [registered trademark] OXE01 (available from BASF), 0.21 g of tricyclodecanedimethanol diacrylate (available from Shin Nakamura Chemical Co., Ltd.), and 0.035 g of pentaerythritol tetrakis(3-mercaptobutyrate) (available from Showa Denko K.K.) were dissolved in 5.08 g of propylene glycol 1-monomethyl ether 2-acetate to prepare a composition. The composition was then filtered through a polyethylene microfilter having a pore diameter of 3 μm to prepare a photosensitive adhesive composition. The mass ratio of the polymer solid content of Preparative Example 1 to the polymer solid content of Preparative Example 2 was 1:6.

Example 4

1.5 g of the solution containing the polymer obtained in Preparative Example 1, 13.34 g of the solution containing the polymer obtained in Preparative Example 3, 0.010 g of IRGACURE [registered trademark] OXE01 (available from BASF), 0.15 g of tricyclodecanedimethanol diacrylate (available from Shin Nakamura Chemical Co., Ltd.), and 0.024 g of pentaerythritol tetrakis(3-mercaptobutyrate) (available from Showa Denko K.K.) were dissolved in 5.49 g of propylene glycol 1-monomethyl ether 2-acetate to prepare a composition. The composition was then filtered through a polyethylene microfilter having a pore diameter of 3 μm to prepare a photosensitive adhesive composition. The mass ratio of the polymer solid content of Preparative Example 1 to a polymer solid content of Preparative Example 3 was 1:9.

Comparative Example 1

8.0 g of the solution containing the polymer obtained in Preparative Example 1, 7.85 g of the solution containing the polymer obtained in Preparative Example 2, 0.052 g of IRGACURE [registered trademark] OXE01 (available from BASF), 0.77 g of tricyclodecanedimethanol diacrylate (available from Shin Nakamura Chemical Co., Ltd.), and 0.013 g of pentaerythritol tetrakis(3-mercaptobutyrate) (available from Showa Denko K.K.) were dissolved in 6.51 g of propylene glycol 1-monomethyl ether 2-acetate to prepare a composition. The composition was then filtered through a polyethylene microfilter having a pore diameter of 3μm to prepare a photocurable resin composition. The mass ratio of the polymer solid content of Preparative Example 1 to the polymer solid content of Preparative Example 2 was 1:1. In Comparative Example 1, the content of a polymer as a component (A) is the same as the content of a polymer as a component (B).

Comparative Example 2

12.0 g of the solution containing the polymer obtained in Preparative Example 1, 3.53 g of the solution containing the polymer obtained in Preparative Example 2, 0.077 g of IRGACURE [registered trademark] OXE01 (available from BASF), 1.16 g of tricyclodecanedimethanol diacrylate (available from Shin Nakamura Chemical Co., Ltd.), and 0.19 g of pentaerythritol tetrakis(3-mercaptobutyrate) (available from Showa Denko K.K.) were dissolved in 6.71 g of propylene glycol 1-monomethyl ether 2-acetate to prepare a composition. The composition was then filtered through a polyethylene microfilter having a pore diameter of 3 μm to prepare a photocurable resin composition. The mass ratio of the polymer solid content of Preparative Example 1 to the polymer solid content of Preparative Example 2 was 1:0.3. In Comparative Example 2, the content of the polymer as the component (B) is smaller than the content of the polymer as the component (A).

Comparative Example 3

14.0 g of the solution containing the polymer obtained in Preparative Example 1, 0.090 g of IRGACURE [registered trademark] OXE01 (available from BASF), 1.36 g of tricyclodecanedimethanol diacrylate (available from Shin Nakamura Chemical Co., Ltd.), and 0.23 g of pentaerythritol tetrakis(3-mercaptobutyrate) (available from Showa Denko K.K.) were dissolved in 6.31 g of propylene glycol 1-monomethyl ether 2-acetate to prepare a composition. The composition was then filtered through a polyethylene microfilter having a pore diameter of 3 μm to prepare a photocurable resin composition. In Comparative Example 3, the photocurable resin composition contain no polymer as the component (B).

Comparative Example 4

14.0 g of the solution containing the polymer obtained in Preparative Example 2 was dissolved in 5.17 g of propylene glycol 1-monomethyl ether 2-acetate to prepare a composition. The composition was then filtered through a polyethylene microfilter having a pore diameter of 3 μm to prepare a resin composition. In Comparative Example 4, the resin composition does not contain the polymer as the component (A) and a radical photopolymerization initiator as a component (C).

[Dissolution Test in Solvent]

The photosensitive adhesive composition prepared in each of Examples 1 to 4 was applied to a silicon wafer by a spin coater, pre-baked at 100° C., exposed by an aligner (PLA-501 manufactured by Canon Inc.) (i-line exposure dose: 500 mJ/cm$^2$), baked at 100° C., developed with NMD-3 (available from TOKYO OHKA KOGYO CO., LTD.), and baked at 200° C. to obtain a film with a thickness of 5 μm. The film was immersed in N-methyl-2-pyrrolidone at 23° C. for 1 minute. For the films formed from the photosensitive adhesive compositions prepared in Examples 1 to 4, a change in thickness before and after immersion was 5% or less. Thus, sufficient solvent resistance was confirmed.

[Development Property Test]

The photosensitive adhesive composition prepared in each of Examples 1 to 4, the photocurable resin composition prepared in each of Comparative Examples 1 to 3, and the resin composition prepared in Comparative Example 4 were applied to a silicon wafer by a spin coater, pre-baked at 100° C., exposed by an aligner (PLA-501 manufactured by Canon Inc.) (i-line exposure dose: 500 mJ/cm$^2$), baked at 100° C., and developed with NMD-3 (available from TOKYO OHKA KOGYO CO., LTD.). The film thicknesses of an exposed area and an unexposed area before and after development were measured. A result calculated as a remaining film ratio ((film thickness after development/film thickness before development)×100) is shown in Table 1 described below.

TABLE 1

|  | Exposed area | Unexposed area |
| --- | --- | --- |
| Example 1 | 75% | 0% |
| Example 2 | 55% | 0% |
| Example 3 | 47% | 0% |
| Example 4 | 46% | 0% |
| Comparative Example 1 | 95% | 31% |
| Comparative Example 2 | 97% | 89% |
| Comparative Example 3 | 98% | 98% |
| Comparative Example 4 | 0% | 0% |

The results in Table 1 show that the films of the photosensitive adhesive compositions prepared in Examples 1 to 4 remained at the exposed area and the films did not remain at the unexposed area. Thus, the patterning property of the photosensitive adhesive compositions prepared in Examples 1 to 4 was confirmed. In contrast, the proportion of a development component in the photocurable resin compositions prepared in Comparative Examples 1 to 3 was lower than that in the photosensitive adhesive compositions prepared in Examples 1 to 4. Thus, the photocurable resin compositions at the unexposed area were each insufficiently developed and removed, and the films of the photocurable resin compositions remained. The resin composition prepared in Comparative Example 4 contained no photocuring component, and thus the film of the resin composition did not remain even at the exposed area.

[Evaluation of Adhesion Force]

The photosensitive adhesive composition prepared in each of Examples 1, 3, and 4 was applied to a 4-inch silicon wafer by a spin coater, pre-baked at 100° C., exposed by an aligner (PLA-501 manufactured by Canon Inc.) (i-line exposure dose: 500 mJ/cm$^2$), baked at 100° C., and developed with NMD-3 to obtain a film with a thickness of 5 μm. The silicon wafer was bonded to a 4-inch glass wafer by a bonding apparatus (VJ-300 manufactured by Ayumi Industries Co., Ltd.) under conditions of a vacuum of 10 Pa or less, a temperature of 160° C., and a bonding pressure of 1,200 kg. The film was cured by heating to 200° C. The bonded wafers were cut into 1 square centimeter by a dicing apparatus (DAD321 manufactured by DISCO Corporation) to prepare a sample for evaluation of adhesive force. Araldite [registered trademark] 2014 (available from Huntsman Advanced Materials LLC) was applied to both surfaces of each of the obtained samples for evaluation of adhesive force. The both surfaces of each of the samples were bonded to a dedicated jig for measurement of adhesive force (shear), and the adhesive force (shear) was then evaluated by Autograph (AUTOGRAPH AGS-100NX manufactured by SHIMADZU Corporation). The adhesion force was measured at a stretching rate of 5 mm/minute. The results are shown in Table 2 described below. An adhesion force of 2,000 N or more in Table 2 means that each of the samples ruptures at a portion coated with Araldite 2014 and each of the samples does not rupture at a portion coated with each of the photosensitive adhesive composition prepared in Example 1, 3, and 4. This shows that the adhesion force of the photosensitive adhesive composition is equal to or higher than the values shown in Table 2. For the samples obtained using the photosensitive adhesive compositions prepared in Examples 1, 3, and 4, sufficient adhesiveness was confirmed.

TABLE 2

|  | Adhesion force (shear) |
| --- | --- |
| Example 1 | 2,000N or more |
| Example 3 | 2,000N or more |
| Example 4 | 2,000N or more |

The invention claimed is:

1. A photosensitive adhesive composition comprising the following components (A), (B), (C), and (D):
   Component (A): a polymer having a structural unit of the following formula (1) and a structure of the following formula (2) at a terminal,
   Component (B): a polymer having the structural unit of formula (1), and a carboxy group or hydroxy group at a terminal,
   Component (C): a radical photopolymerization initiator, and
   Component (D): a solvent,
      wherein the content by mass of the component (B) is larger than that of the component (A),

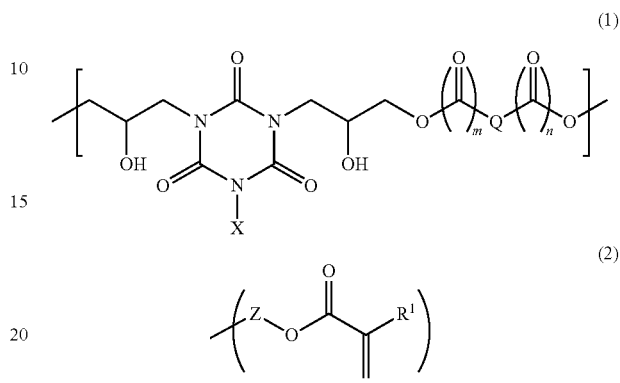

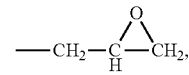

wherein
   X is methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, —CH=CH$_2$, —CH$_2$—CH=CH$_2$, or $$-CH_2-\underset{H}{\overset{O}{\underset{\diagup \diagdown}{C}}}-CH_2,$$

m and n are each independently 0 or 1,
Q is a divalent $C_{1-16}$ hydrocarbon group,
Z is a divalent $C_{1-4}$ linking group, the divalent linking group being bonded to an —O— group in formula (1), and
$R^1$ is a hydrogen atom or a methyl group.

2. The photosensitive adhesive composition according to claim 1, wherein the divalent hydrocarbon group of Q in formula (1) is a linear or branched alkylene group, a group containing two carbon atoms bonded through a double bond, or a group containing in a main chain an alicyclic hydrocarbon group or aromatic hydrocarbon group optionally having at least one substituent.

3. The photosensitive adhesive composition according to claim 1, wherein the divalent linking group of Z in formula (2) is a linear or branched alkylene group optionally having at least one hydroxy group as a substituent.

4. The photosensitive adhesive composition according to claim 1, wherein the mass ratio of the component (A) to the component (B) is 1:2 to 1:20.

5. The photosensitive adhesive composition according to claim 1, further comprising a bifunctional (meth)acrylate and/or a multifunctional thiol.

6. An adhesion method comprising steps of:
applying the photosensitive adhesive composition according to claim 1 to a first substrate;
pre-baking the photosensitive adhesive composition applied to the first substrate at 50° C. to 160° C.;
exposing the coating film on the first substrate after the pre-baking;
developing the coating film after the exposure; and
bonding a second substrate to the first substrate after the development and thermally curing the coating film by heating.

* * * * *